(12) United States Patent
Tanji

(10) Patent No.: US 6,201,443 B1
(45) Date of Patent: Mar. 13, 2001

(54) RADIO FREQUENCY VARIABLE GAIN AMPLIFIER FABRICATED IN COMPLEMENTARY METAL OXIDE SEMICONDUCTOR TECHNOLOGY

(75) Inventor: Todd M. Tanji, Egan, MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/196,831

(22) Filed: Nov. 20, 1998

Related U.S. Application Data
(60) Provisional application No. 60/066,219, filed on Nov. 20, 1997.

(51) Int. Cl.$^7$ ................. H03F 3/45; H03G 3/30
(52) U.S. Cl. ............................ 330/254; 330/253
(58) Field of Search .................... 330/253, 254; 327/359

(56) References Cited

U.S. PATENT DOCUMENTS

| | | | |
|---|---|---|---|
| 4,658,220 | 4/1987 | Heston et al. | 330/277 |
| 4,853,649 | 8/1989 | Seino et al. | 330/277 |
| 4,868,517 * | 9/1989 | Waldhauer et al. | 330/254 |
| 5,111,157 | 5/1992 | Komiak | 330/286 |
| 5,418,494 * | 5/1995 | Betti et al. | 330/254 |
| 5,574,405 | 11/1996 | Razavi | 331/2 |
| 5,587,688 * | 12/1996 | Mulbrook | 330/253 |
| 5,663,690 | 9/1997 | McGinn | 331/109 |
| 5,757,230 | 5/1998 | Mangelsdorf | 330/133 |
| 5,764,109 | 6/1998 | Kukkonen | 331/44 |
| 5,818,880 | 10/1998 | Kriz et al. | 375/306 |

* cited by examiner

*Primary Examiner*—Steven J. Mottola
(74) *Attorney, Agent, or Firm*—Gray Cary Ware Freidenrich

(57) ABSTRACT

The VGA according to the present invention generally includes a first gain cell, a second gain cell that is operably connected to the first gain cell, and a current control circuit portion that is operably connected to the first and second gain cells. The first gain cell has a transconductance and preferably comprises a pair of MOSFETs. The second gain cell has a transconductance and also preferably comprises a pair of MOSFETs. The first and second gain cells receive an input signal and produce an output signal that is amplified in proportion to their transconductance. The current control circuit portion controls the amount of current sent to the first and second gain cells and, as such, also controls their transconductance. Note that the transconductance of the first gain cell is designed to be larger by a predetermined amount than the transconductance of the second gain cell for a given amount of current.

30 Claims, 2 Drawing Sheets

RADIO FREQUENCY VARIABLE GAIN AMPLIFIER FABRICATED IN COMPLEMENTARY METAL OXIDE SEMICONDUCTOR TECHNOLOGY

CROSS-REFERENCE TO RELATED APPLICATIONS

This application claims priority under 35 USC § 119 to U.S. patent application Ser. No. 60/066,219, filed Nov. 20, 1997, which is hereby incorporated by reference.

BACKGROUND OF THE INVENTION

1. Field of the Invention

The invention relates to radio frequency communication and more particularly, to variable gain amplifiers used in radio frequency signal transmission systems.

2. Description of Related Art

Variable gain amplifiers (VGAs), devices that attempt to maintain a desired output signal level by adjusting gain, are generally used with radio receivers. As such, the cost of a VGA is significant to the overall cost of the radio receiver function. Currently, most VGAs are fabricated with bipolar processes. Bipolar processes are expensive, costing nearly twice as much as a CMOS fabrication processes. However, little development of VGAs in CMOS has occurred due to noise concerns and due to concerns of integrating VGAs fabricated in CMOS with other radio frequency functions because variation in the input and output impedances of a VGA fabricated with CMOS technology can significantly affect the overall operation of a radio frequency system.

One development of a variable gain CMOS amplifier may be found in U.S. Pat. No. 5,757,230. The variable gain amplifier of the '230 patent uses a linearized transconductor in conjunction with an output circuit. The transconductor has a transconductance that varies in response to a first control signal while the output circuit has a transresistance that varies in response to a second control signal. Both control signals are provided by a gain controller circuit portion. The voltage gain of the amplifier is equal to the product of the transconductance and the transresistance. The amplifier can be configured to provide an exponential gain. The amplifier of the '230 patent is a complicated device requiring as many as 50 transistors to implement.

In view of the above, there is a need for a VGA that can be fabricated with low-cost CMOS technology, provide a desirable signal-to-noise ratio, and maintain predetermined, and constant input and output impedances while providing a straight forward design.

SUMMARY OF THE INVENTION

The needs described above are in large measure met by a variable gain amplifier (VGA) of the present invention. The VGA generally includes a first gain cell, a second gain cell that is operably connected to the first gain cell, and a current control circuit portion that is operably connected to the first and second gain cells. The first gain cell has a transconductance and preferably comprises a pair of MOSFETs. The second gain cell has a transconductance and also preferably comprises a pair of MOSFETs. The first and second gain cells receive an input signal and produce an output signal that is amplified in proportion to their transconductance. The current control circuit portion controls the amount of current sent to the first and second gain cells and, as such, also controls their transconductance. Note that the transconductance of the first gain cell is designed to be larger by a predetermined amount than the transconductance of the second gain cell for a given amount of current.

The present invention further includes a method of amplifying an input signal. The steps for amplifying the input signal are as follows: (1) providing a variable control voltage; (2) providing a current; (3) receiving an input signal; (4) directing an amount of current to a first gain cell and a second gain cell according the level of the variable control voltage (the amount of current may be zero amps); (5) generating a gain from the first and second gain cells (the amount of gain may be zero); (6) amplifying the input signal with the gain from the first and second gain cells; and (7) producing an output reflective of the amplified input signal.

DETAILED DESCRIPTION OF THE PREFERRED EMBODIMENTS

A radio frequency, variable gain amplifier (VGA) 20 for use in radio frequency communication systems is described herein.

Figure 1:
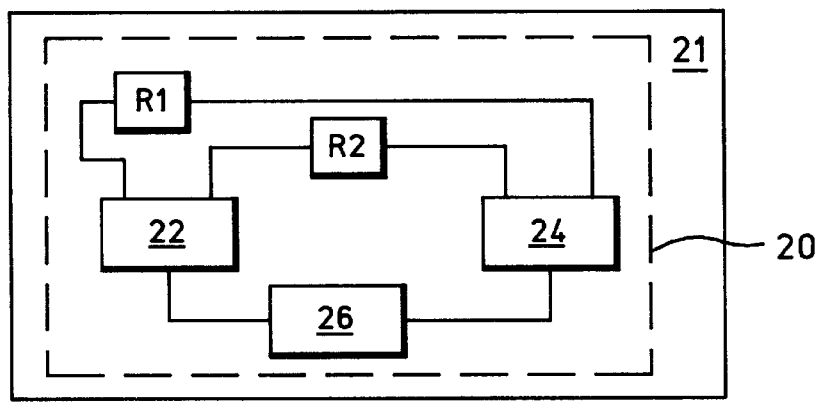
FIG. 1 is a schematic illustration of an integrated circuit (IC) containing a radio frequency, variable gain amplifier according to the present invention.

Referring to FIG. 1, an integrated circuit (IC) 21 is shown containing VGA 20. VGA 20 generally comprises a first gain cell 22, a second gain cell 24 that is operably connected to gain cell 22, and current control portion 26 that is operably connected to gain cell 22 and gain cell 24. IC 21 is preferably fabricated using a low-cost, complementary metal oxide semiconductor (CMOS) technology. The integration of VGA 20 in a digital CMOS process allows for implementation of radio receivers onto a single IC for high-volume, cost-sensitive applications.

Figure 2:
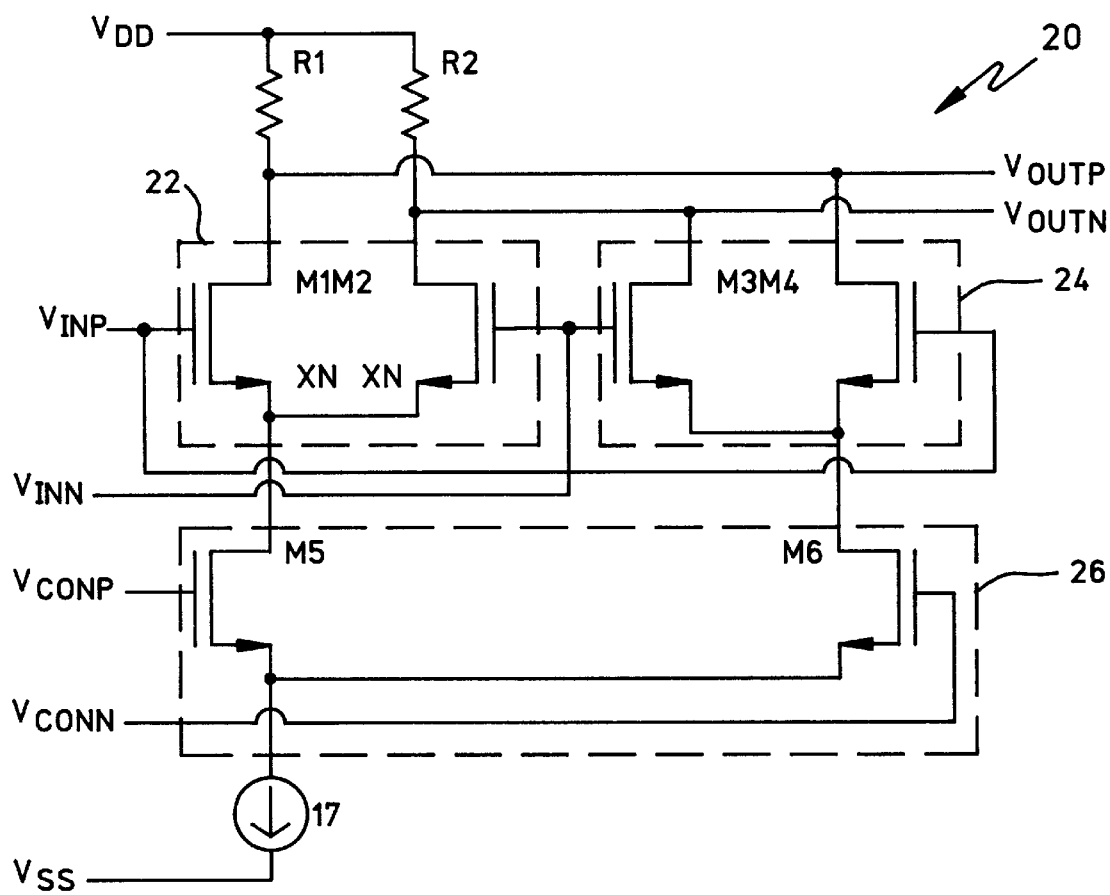
FIG. 2 is a circuit diagram of the radio frequency, variable gain amplifier according to the present invention.

Referring to FIG. 2, a detailed schematic of VGA 20 is provided. MOSFETs M1 and M2 are arranged as a differential pair to form first gain cell 22. MOSFETs M3 and M4 are arranged as a differential pair to form second gain cell 24. MOSFETS M5 and M6 are arranged as a differential pair to form current control portion 26, which will be described in detail below. Resistor R1 is connected between positive voltage terminal $V_{DD}$, which is preferably approximately 3 V, and the drains of M1 and M4. Resistor R2 is connected between $V_{DD}$ and the drains of M2 and M3. The source of M1 is tied to the source of M2 and to the drain of M5. The gates of M1 and M4 are connected to the positive side, $V_{INP}$, of a differential input voltage signal. The gates of M2 and M3 are connected to the negative side, $V_{INN}$, of the differential input voltage signal. The gate of M5 is connected to the positive side, $V_{CONP}$, of a control voltage while the gate of M6 is connected to the negative side, $V_{CONN}$, of the control voltage. The source of M5 is tied to the source of M6 which are both connected to current source I1, which is also tied to a ground terminal, $V_{SS}$. The differential output of VGA 20 is provided between $V_{OUTP}$, which is connected to the drain of M1 and M4, and $V_{OUTN}$, which is connected to the drain of M2 and M3.

As indicated above, VGA 20 includes two gain cells 22 and 24 formed by transistors M1, M2, M3 and M4, which are connected in parallel. M1 and M2 preferably have larger gate widths, by a factor of N, than M3 and M4. As such, M1 and M2 provide a larger transconductance for a given bias current by a factor of $\sqrt{N}$. To explain further, the programmable gain range of VGA 20 is determined by N. Since current gain in MOS transistors follows a square law, the gain range is equal to the $\sqrt{N}$. Thus, as by way of a non-limiting example, for a desired programmable gain range of $$\frac{3V}{V}$$

N will be 9, and, the gate widths of M1 and M2 will be nine (9) times the gate widths of M3 and M4.

With regard to the circuit impedance of VGA 20, the input impedance of VGA 20 is dependent upon the total gate capacitance of M1, M2, M3, and M4 while the differential output impedance of VGA 20 is equal to (R1+R2). Neither the input impedance or the output impedance change with gain programming. This is an important feature in that when VGA 20 is integrated with other radio frequency functions, e.g. receivers, mixers, limiters, voltage controlled oscillators, etc., their operation is not affected. This is especially important when impedance matching along transmission lines is used for efficient power transfer.

Current control portion 26, formed by M5 and M6, controls the proportional amount of bias current, I1, that is steered through either gain cell 22 or 24. When $V_{CONP} \gg V_{CONN}$, M5 is driven into saturation while M6 is off and, thus, all the available bias current is steered through M1 and M2. When this occurs, VGA 20 is in its maximum gain state. When $V_{CONP} \ll V_{CONN}$, M6 is driven into saturation while M5 is off and, thus, all the available bias current is steered through M3 and M4. When this occurs, the gain of VGA 20 is in its minimum gain state wherein the gain is decreased by a factor of $\sqrt{N}$ from the maximum gain state. When the control voltage, $V_{CON}$, is between the two described extremes, the gain of VGA 20 varies in an analog fashion fluctuating between the maximum and minimum gain states dependent upon the input control signals.

The actual gain of VGA 20 is defined as follows:

$$gain = Gm*R \qquad (1)$$

where:

Gm is the effective transconductance of gain cell 22 or 24; and

R is the load resistance (either R1 or R2 depending upon which signal is greater $V_{INP}$ or $V_{INN}$).

By way of a non-limiting example, if VGA 20 is designed for operation at 10.7 MHz, typical component values would be as follows:

I1=100 μAmps;

R1=R2=20 kohms; and

N=9.

As such, when $V_{CONP} \gg V_{CONN}$, the maximum gain is defined as follows:

$$gain_{MAX} = Gm_{MAX}*R \qquad (2)$$

where:

$Gm_{MAX}$ is the small signal transconductance of M1 or M2 and

R is the value of R1 or R2 (20 kohms).

When $V_{CONP} \ll V_{CONN}$, the minimum gain is defined as follows:

$$gain_{MIN} = Gm_{MIN}*R \qquad (3)$$

where:

$Gm_{MIN}$ is the small signal transconductance of M3 or M4 and

R is the value of R1 or R2 (20 kohms).

Typical values for gain in this example would be a minimum gain of $$\frac{1V}{V}$$

and a maximum gain of $$\frac{3V}{V}$$

The above example describes VGA 20 designed for 10.7 MHz operation, however, VGA 20 may be designed for any desirable frequency, i.e. radio frequencies and intermediate frequencies such as DC to 1 GHz, noting that the frequency is also dependent on the performance capability of the CMOS fabrication process.

In operation, VGA 20 works as follows. Control circuit portion 26 dictates the amount of gain derived from VGA 20. For example, as previously stated, if $V_{CONP} \gg V_{CONN}$, M5 is driven into saturation while M6 is off. This effectively eliminates gain cell 24 from VGA 20 because there is no current at the source of M3 and M4. Continuing with the situation where $V_{CONP} \gg V_{CONN}$, if $V_{INP} \gg V_{INN}$ (assume $V_{INN}$ is zero), then M1 is driven into saturation and M2 is off, thus all of current I1 flows through M1. In this condition, $V_{OUTP} = V_{DD} - I1(R1)$ and $V_{OUTN} = V_{DD}$. In the situation where $V_{INP}$ is only slightly different from $V_{INN}$ (only a few millivolts difference) the difference between $V_{OUTP}$ and $V_{OUTN}$ is the differential gain. In this situation, $V_{INP} - V_{INN} = V_{IP}$, which is the differential input voltage. The differential input voltage is amplified by the gain factor, which is determined, as described above, from the effective transconductance of the respective gain cell and the load resistance. When $V_{CONP}$ is only slightly larger or smaller than $V_{CONN}$, a proportional amount of current I1 will flow through each of M5 and M6, thus varying the differential output signal.

VGA 20, as described above, has the feature of a non-decreasing signal-to-noise ratio (SNR) in the face of decreasing gain. The input referred noise of VGA 20 is defined as follows:

$$\text{input referred noise} = \sqrt{\frac{8kT}{3Gm}} \qquad (4)$$

where:

k is Boltzman's constant;

T is the absolute temperature; and

Gm is the effective transconductance of gain cell 22 or 24.

Figure 3:
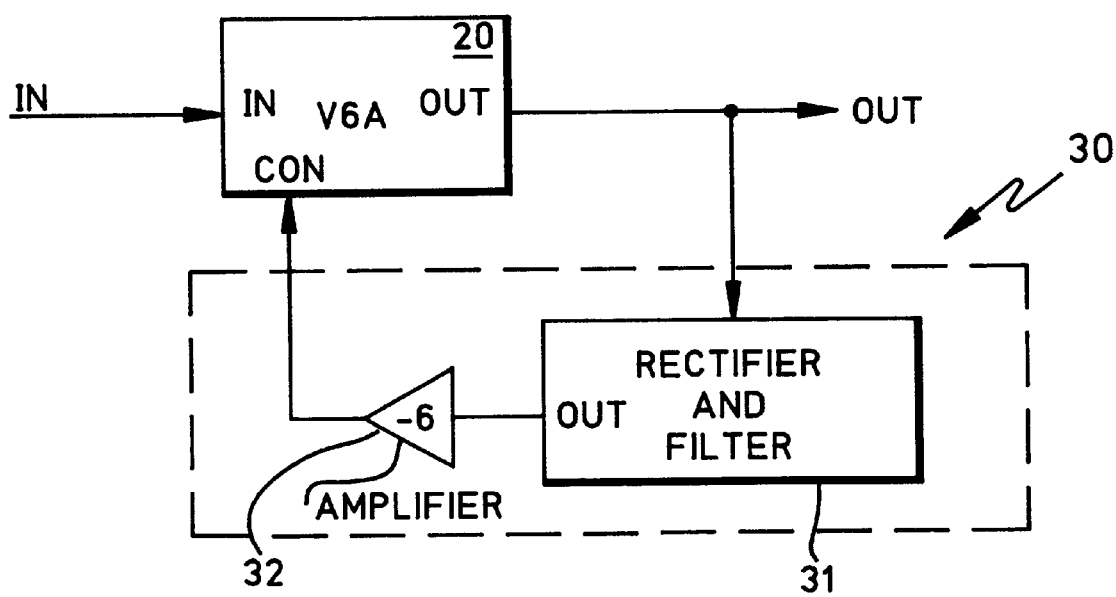
FIG. 3 is a schematic illustration of an automatic gain loop that may be used with the variable gain amplifier according to the present invention.

In one embodiment, VGA 20 may be used in conjunction with an automatic gain feedback loop (AGC) 30, including a rectifier and filter circuit portion 31, and an amplifier 32, as shown in FIG. 3. In this embodiment, the gain of VGA 20 is adjusted to maintain a constant output signal level by AGC 30. By way of a non-limiting example, if the input voltage is increased twofold, i.e. 2×, AGC 30 will decrease the gain twofold, i.e. 2×, by decreasing Gm proportionally. In the case of a twofold increase, the input referred noise increases by a factor of $\sqrt{2}$, i.e. $(\sqrt{2})(x)$. Hence, the SNR of VGA 20 will increase by a factor of √2, or, in other words, VGA 20 has a non-decreasing signal-to-noise ratio (SNR) in the face of decreasing gain.

VGA 20 also has the feature of a constant output saturation level that is independent of gain. The output saturation level occurs when large signals are present at the differential input, i.e. when $V_{INP} \gg V_{INN}$, or, when $V_{INN} \gg V_{INP}$. At either of these conditions, all of the available bias tail current I1 flows through either R1 or R2, as previously described in detail. As such, the resulting peak-to-peak differential output voltage $V_{OUT}$ is independent of the proportion of the tail current which flows through M5 or M6 and, therefore, the maximum output voltage is independent of gain.

VGA 20 further includes the feature of fixed power dissipation over all gain variations. Power dissipation, i.e. power=(V)(I), is determined by the supply voltage $V_{DD}$, which is typically 3V, and by the current drain. The current drain in VGA 20 is equal to the tail current I1. Since I1 is fixed, and, as such, does not change with gain setting, the power dissipation of VGA 20 is independent of the circuit operation. This feature is important in that VGA 20 may avoid unpredictable and/or excessive power dissipation changes with radio frequency system operation.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A variable gain amplifier, comprising:
    an input terminal;
    a first gain generating circuit portion connected to the input terminal, wherein said first gain generating circuit portion has a first transconductance;
    a second gain generating circuit portion connected to the input terminal, and wherein said second gain generating circuit portion has a second transconductance, wherein said first transconductance is larger by a predetermined amount than said second transconductance for a given amount of current, wherein said second gain generating circuit portion is operably connected to said first gain generating portion, and wherein said first and second gain generating circuit portions produce an output signal that is amplified in proportion to said first transconductance and said second transconductance, respectively; and,
    a current control circuit portion operably connected to said first and second gain generating circuit portions, wherein said current control circuit portion controls the amount of current to said first and second gain generating circuit portions, wherein said current control circuit portion comprises first and second MOSFETs configured as a differential pair.

2. The amplifier of claim 1, wherein said first gain generating circuit portion comprises first and second MOSFETs configured as a differential pair.

3. The amplifier of claim 1, wherein said second gain generating circuit portion comprises first and second MOSFETs configured as a differential pair.

4. The amplifier of claim 1, wherein said first and second gain generating circuit portions and said current control portion are fabricated on a single, CMOS integrated circuit (IC) chip.

5. The amplifier of claim 1, further comprising an automatic gain control circuit connected to the current control portion.

6. The amplifier of claim 5, wherein said amplifier maintains a non-decreasing signal-to-noise ratio in the face of a decreasing gain.

7. The amplifier of claim 6, wherein said decreasing gain is adjusted by said automatic gain control circuit.

8. The amplifier of claim 1, further comprising an input impedance and an output impedance.

9. The amplifier of claim 8, wherein said input impedance and said output impedance are constant.

10. The amplifier of claim 1, wherein said amplifier maintains a constant output signal saturation level.

11. The amplifier of claim 1, wherein said amplifier has a gain and a power dissipation, and wherein said power dissipation is fixed over all gain variations.

12. The amplifier of claim 1, wherein said first and second transconductances are modified according to a control voltage.

13. A variable gain amplifier, comprising:
    a first gain generating means for generating a first gain, said first gain generating means having a first transconductance;
    a second gain generating means for generating a second gain, said second generating means having a second transconductance, wherein said second gain generating means is operably connected to said first gain generating means, wherein said first transconductance is larger by a predetermined amount than said second transconductance for a given amount of current, wherein said first and second gain generating means receive an input signal, and wherein said first and second gain generating means produce an output signal that is amplified in proportion to said first gain and said second gain, respectively; and,
    a current control means operably connected to said first and second gain generating means, said current control means for controlling the amount of current to said first and second gain generating means, wherein said current control means comprises first and second MOSFETs configured as a differential pair.

14. The amplifier of claim 13, wherein said first gain generating means comprises first and second MOSFETs configured as a differential pair.

15. The amplifier of claim 13, wherein said second gain generating means comprises first and second MOSFETs configured as a differential pair.

16. The amplifier of claim 13, wherein said first and second gain generating means and said current control means are fabricated on a single, CMOS integrated circuit (IC) chip.

17. The amplifier of claim 13, further comprising an automatic gain control means connected to said current control means.

18. The amplifier of claim 17, wherein said amplifier maintains a non-decreasing signal-to-noise ratio in the face of decreasing gain.

19. The amplifier of claim 18, wherein said decreasing gain is adjusted by said automatic gain control means.

20. The amplifier of claim 13, further comprising an input impedance and an output impedance.

21. The amplifier of claim 20, wherein said input impedance and said output impedance are constant.

22. The amplifier of claim 13, wherein said amplifier maintains a constant output signal saturation level.

23. The amplifier of claim 13, wherein said amplifier has a power dissipation, and wherein said power dissipation is fixed over all gain variations.

24. The amplifier of claim 13, wherein said first and second transconductances are modified according to a control voltage.

25. A method of amplifying an input signal, comprising the steps of:
   providing a variable control voltage;
   providing a current source;
   receiving an input signal;
   using two MOSFETs configured as a differential pair, directing an amount of said current to a first gain cell having a first transconductance and a second gain cell having a second transconductance, wherein said first transconductance is larger by a predetermined amount than said second transconductance, for a given amount of current;
   according to the level of said variable control voltage; generating a gain from said first and second gain cells;
   amplifying said input signal with said gain from said first and second gain generating circuit portions; and
   outputting the amplified input signal.

26. The method of claim 25, further comprising the step of maintaining a constant output signal level.

27. The method of claim 25, wherein said first gain cell comprises two MOSFETs configured as a differential pair.

28. The method of claim 25, wherein said second gain cell comprises two MOSFETs configured as a differential pair.

29. The method of claim 25, wherein said first gain cell comprises a first pair of MOSFETs, wherein said second gain cell comprises a second pair of MOSFETs, and wherein said step of directing an amount of said current is performed by a circuit portion comprising a third pair of MOSFETs.

30. The method of claim 29, wherein said first gain generating circuit portion, said second gain generating circuit portion, and said circuit portion are fabricated on a single, CMOS integrated circuit.

* * * * *